United States Patent [19]
Cioaca

[11] Patent Number: 4,855,955
[45] Date of Patent: Aug. 8, 1989

[54] THREE TRANSISTOR HIGH ENDURANCE EEPROM CELL

[75] Inventor: Dumitru G. Cioaca, Cupertino, Calif.

[73] Assignee: Seeq Technology, Inc., San Jose, Calif.

[21] Appl. No.: 179,527

[22] Filed: Apr. 8, 1988

[51] Int. Cl.$^4$ .................. G11C 11/34; G11C 7/00; H01L 29/78; H01L 27/02

[52] U.S. Cl. .................. 365/185; 365/187; 365/189/01; 357/23.5; 357/41

[58] Field of Search .............. 365/94, 185, 187, 186, 365/182, 189.01, 230.01, 182; 357/23.6, 23.5, 41, 45

[56] References Cited

U.S. PATENT DOCUMENTS

| | | | |
|---|---|---|---|
| 4,425,631 | 1/1984 | Adam | 365/185 |
| 4,580,247 | 4/1986 | Adam | 365/185 |
| 4,630,085 | 12/1986 | Koyama | 365/185 |
| 4,636,984 | 1/1987 | Neukomm | 357/23.5 |
| 4,677,590 | 6/1987 | Arakawa | 365/185 |
| 4,752,912 | 7/1988 | Guterman | 365/185 |

OTHER PUBLICATIONS

Coffman, Tim, et al., A 1Mb CMOS EPROM with a 13.5μm$^2$ cell, Feb. 25, 1987, pp. 72-73, 1987 IEEE International Solid-State Circuits Conference.

Primary Examiner—Stuart N. Hecker
Assistant Examiner—Mellissa J. Koval
Attorney, Agent, or Firm—Lyon & Lyon

[57] ABSTRACT

The memory cell of the present invention is a three transistor cell, including two floating gate MOS transistors connected in series with a select transistor. The source of the first memory cell floating gate memory transistor is connected to a source of a first potential. Its gate is connected to a first sense line. Its drain is connected to the source of the second memory cell floating gate transistor. The gate of the second memory cell floating gate transistor is connected to a second sense line. The drain of the second memory cell floating gate transistor is connected to the source of a select transistor. The gate of the select transistor is connected to a word line. The source of the select transistor is connected to a bit line.

A plurality of memory cells may be connected together as a byte, and may be placed in an array. The gates of the select transistors are connected together. A word line signal which drives the gates of the select transistors also drives the gates of two sense line byte select transistors which enable the sense line signals to appear on only the gates of the memory cell floating gate transistors of the selected byte.

2 Claims, 5 Drawing Sheets

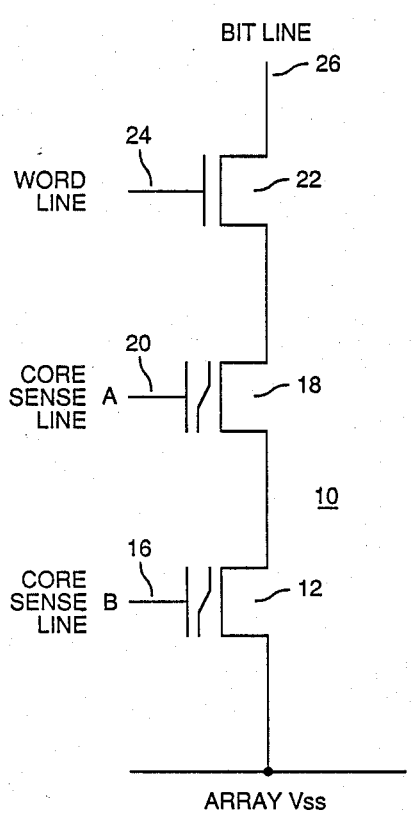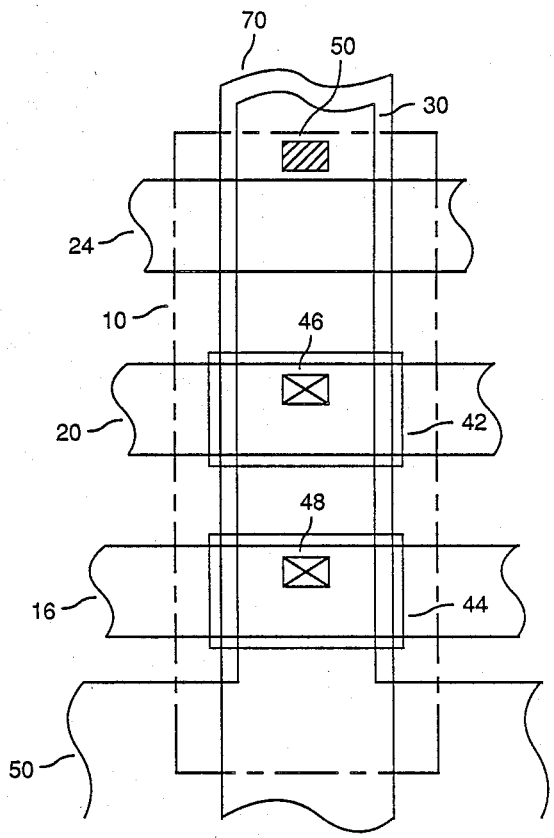
FIGURE 1a
FIGURE 1b

| SIGNAL | VOLTAGE LEVEL | PROGRAMMING CYCLE | | |
|---|---|---|---|---|
| | | ERASE | WRITE 1 | WRITE 2 |
| BIT LINE 26 | H.V. Vcc L.V. | L.V. | H.V. | H.V. |
| WORD LINE 24 | H.V. Vcc L.V. | H.V. | H.V. | H.V. |
| CORE SENSE LINE A 20 | H.V. Vcc L.V. | H.V. | L.V. | Vcc |
| CORE SENSE LINE B 16 | H.V. Vcc L.V. | H.V. | L.V. | L.V. |
| ARRAY Vss 14 | H.V. Vcc L.V. | L.V. | FLOATING | FLOATING |

L.V. = APPROX 0 V 100   102   104

FIGURE 3

| SIGNAL | VOLTAGE LEVEL | PROGRAMMING CYCLE | |
|---|---|---|---|
| | | ERASE | WRITE |
| BIT LINE | H.V. Vcc L.V. | L.V. | H.V. |
| WORD LINE 130 | H.V. Vcc L.V. | H.V. | H.V. |
| SENSE LINE A 132 | H.V. Vcc L.V. | H.V. | pulsing Vcc/L.V. |
| SENSE LINE B 134 | H.V. Vcc L.V. | H.V. | pulsing Vcc/L.V. |
| ARRAY Vss 14 | | FLOATING | FLOATING |

L.V. = APPROX 0 V      120      136

*FIGURE 5*

THREE TRANSISTOR HIGH ENDURANCE EEPROM CELL

BACKGROUND OF THE INVENTION

1. Field Of The Invention

The present invention relates to semiconductor memory. More particularly, the present invention relates to electrically erasable programmable read only memory (EEPROM) memory, and specifically a high endurance EEPROM cell for use in EEPROM arrays.

2. The Prior Art

Floating gate EEPROM memory devices are well-known. Arrays of such memory cells have been commercially available for some time. One problem, common to all semiconductor devices, and to such memory devices in particular, is that of reliability. A particularly important parameter in EEPROM arrays is endurance, that is the number of times an EEPROM cell may be programmed and erased, before the cell fails. In most cases, an EEPROM array device is useless after the failure of one cell, unless the system into which it is installed is capable of dynamically reconfiguring around the failed cell. Numerous solutions have been proposed for the situation where an EEPROM memory cell, initially functioning, later becomes inoperative. Such schemes include error-correcting codes, redundancy and voting logic, differential sensing, and other similar schemes.

One such prior art scheme uses two floating gate memory cell transistors and associated select transistors per cell, resulting in a four transistor cell. The two outputs of the cell are connected to a NOR gate. Thus, if one of the floating gate memory transistors in the cell fails from a faulty tunnel dielectric (and thus tends to turn on the leaky transistor), the sensing circuitry will ignore that fact. This structure is disclosed in Cioaca et al., *A Million Cycle CMOS 256K EEPROM*, ISSCC' 87 Digest of Technical Papers, p. 79. This scheme is used in the EEPROM products designated 2816, 2864, 28C64, 52B33, and 28C256, made by SEEQ Technology, Inc., the assignee of the present invention.

The problem of reliability and the various solutions heretofore proposed often present a dichotomy. The current trend towards increased density of memory devices has increased the demand for smaller die size, hence smaller cell size, in order to increase yield. However, the solutions presented to overcome reliability problems often conflict with this aforementioned goal, since cell size or die area is often increased in order to accommodate such solutions. Hence, there is a need for an EEPROM cell structure which is small in size yet provides adequate reliability.

BRIEF DESCRIPTION OF THE INVENTION

The memory cell of the present invention is a three transistor cell, including two floating gate MOS transistors connected in series with a select transistor. The source of the first memory cell floating gate memory transistor is connected to a source of a first potential. Its control gate is connected to a first sense line. Its drain is connected to the source of the second memory cell floating gate transistor. The control gate of the second memory cell floating gate transistor is connected to a second sense line. The drain of the second memory cell floating gate transistor is connected to the source of a select transistor. The gate of the select transistor is connected to a word line. The source of the select transistor is connected to a bit line.

A plurality of memory cells may be connected together as a byte, and may be placed in an array. The control gates of the corresponding memory cell floating gate transistors are connected together. The gates of the select transistors are connected together. A word line signal which drives the gates of the select transistors also drives the gates of two sense line byte select transistors which enable the sense line signals to appear on only the control gates of the memory cell floating gate transistors of the selected byte. Bit line connections from each memory cell are connected to a bit line and then through a bit line select device to a data line. The sense lines signals are connected through two sense line select devices. The gates of the sense line select devices and the bit line select devices are all connected to a column selector.

BRIEF DESCRIPTION OF THE DRAWINGS

FIG. 1a is a schematic diagram of a memory cell of the present invention.

FIG. 1b is a physical layout drawing of the memory cell of FIG. 1a.

FIG. 3 is a timing diagram illustrating the programming sequence for the array of FIG. 2.

FIG. 5 is a timing diagram illustrating the programming sequence for the array of FIG. 4.

DETAILED DESCRIPTION OF A PREFERRED EMBODIMENT

Figure 2:
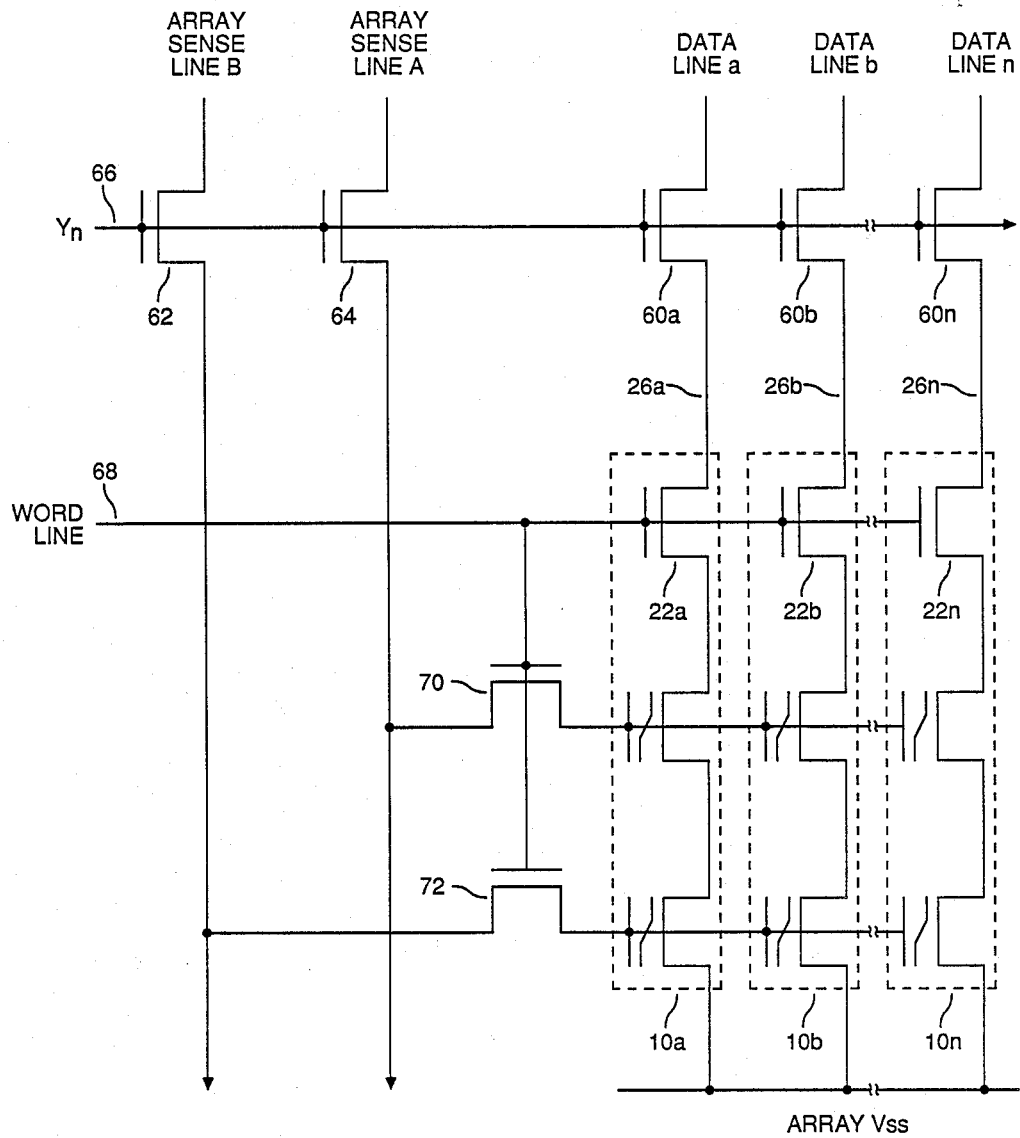
FIG. 2 is a schematic diagram of a representative array configured according to a first embodiment of the present invention.

Referring first to FIG. 1, a schematic diagram of a memory cell configured according to the present invention, memory cell 10 is shown to include a first memory cell floating gate transistor 12 having its source connected to a source of a first potential 14 (here shown as Array $V_{ss}$). The control gate of first memory cell floating gate transistor 12 is connected to a first core sense line 16. The drain of first memory cell floating gate transistor 12 is connected to the source of second memory cell floating gate transistor 18. The control gate of second memory cell floating gate transistor 18 is connected to a second core sense line 20. The drain of second memory cell floating gate transistor 18 is connected to the source of a select transistor 22. The gate of select transistor 22 is connected to a word line 24. The drain of select transistor 22 is connected to bit line 26.

Referring now to FIG. 1b, a physical layout of the memory cell of FIG. 1a, transistors 12, 18, and 22 are formed from a diffusion area 30. Strips of second level polysilicon form sense line 16, sense line 20, and word line 24. As will be apparent to those of ordinary skill in the art, second level polysilicon strip 16 directly forms the control gate of first floating gate memory cell transistor 12, second level polysilicon strip 20 forms the control gate of second floating gate memory transistor 18, and second level polysilicon strip 24 forms the gate of select transistor 22. First level polysilicon regions 42 and 44, respectively, form the floating gates of memory cell transistors 12 and 18. Regions 46 and 48, respectively, form the thin dielectric tunneling regions of memory cell floating gate transistors 12 and 18.

The memory cell is connected to the metal bit line 70 by the metal-to-diffusion contact 50. The metal-to-diffusion contact 50 may be shared by a neighboring memory cell, as is known in the art.

As will be apparent to anyone of ordinary skill in the art from an examination of FIGS. 1a and 1b, the three transistor memory cell of the present invention can be fabricated using conventional NMOS or CMOS processing techniques. In addition, conventional floating gate memory cell transistors may be used. It is preferred, however, that memory cell floating gate transistors 12 and 18 be depletion devices, having their thresholds set to approximately minus four volts in the programmed (conductive) state and plus four volts in their cleared (non-conductive) state. Those of ordinary skill in the art will realize, however, that other transistors, such as native or enhancement devices, could also be used with the present invention.

The three transistor memory cell of the present invention may also be placed in an array. FIG. 2 illustrates how a plurality of the three transistor memory cells of FIGS. 1a and 1b are placed into an array.

Referring now to FIG. 2, memory cells 10a, 10b and 10n are shown in an array. Those of ordinary skill in the art will recognize that any number of cells could be so connected, although three cells are shown for purposes of illustration. The drain ends of the select transistors of memory cells 10a, 10b, and 10n are connected to the source ends of bit line select transistors 60a, 60b, and 60n respectively and form the bit lines 26a, 26b, and 26n respectively. The drain ends of bit line select transistors 60a, 60b, and 60n are connected to the data lines for the memory array shown as Data Lines a, b, and n in FIG. 2. Sense line select transistors 62 and 64 have their drain ends connected to first and second array sense lines designated array sense lines A and B. A typical chip will have 2 array sense lines.

The gates of transistors 60a, 60b, 60n, 62, and 64 are all commonly connected to Y select line $Y_n$. The line $Y_n$ selects an entire column of bytes. There are therefore one set of transistors 60a, 60b, 60n, 62 and 64 per column of bytes in the memory array.

Word line 68 functions to select one byte from a selected column. Word line 68 functions by turning on the gates of the select transistors 22a, 22b, and 22n in the three illustrative memory cells. Word line 68 also functions to turn on byte sense line enable devices 70 and 72. Byte sense line enable devices 70 and 72, of which there are one set per byte, function to enable the sense line signal onto the control gates of the memory cell floating gate transistors in the memory cells of only the selected byte. Devices 60a, 60b, through 60n should preferably be enhancement devices. Devices 62, 64, 70, and 72 should preferably be depletion or native devices.

Since the memory cell floating gate transistors 12 and 18 of memory cell 10 are connected in series, conventional programming sequences cannot be used to program the memory cell. To program the three transistor memory cell of the present invention, the programming cycle depicted in FIG. 3 must be applied. In a first step, shown at 100, the floating gate transistors 12 and 18 are erased (cleared) by raising the sense line 20, sense line 16 and word line 24 to high voltage and keeping the bit line 26 and Array Vss line at low voltage. Under these conditions memory cell floating gate transistors 12 and 18 become nonconductive. During the second step of the programming cycle, shown at 102, (write 1), bit line 26 is raised to high voltage. Word line 24 is kept at its high voltage level. Sense line 20 and sense line 16 are discharged to low voltage and the Array Vss line 14 becomes electrically unnconnected (floating).

Under these conditions, memory cell floating gate transistor 18 becomes conductive and some of the high voltage from bit line 26 now appears on the drain of memory cell floating gate transistor 12. This voltage, however, is not high enough to program (write) the device. At this point, the third, programming step, shown at 104, (write 2) begins. Sense line 20 is raised to a voltage higher than the threshold of the device but lower then its drain voltage. This voltage should be kept below the drain voltage or else the device will begin to erase. Under these conditions, the high voltage on the drain of memory cell floating gate transistor 18 is imparted to the drain of memory cell floating gate transistor 12 without significant drop across the channel of memory cell floating gate transistor 18. At this point memory cell floating gate transistor 12 also becomes conductive.

Figure 4:
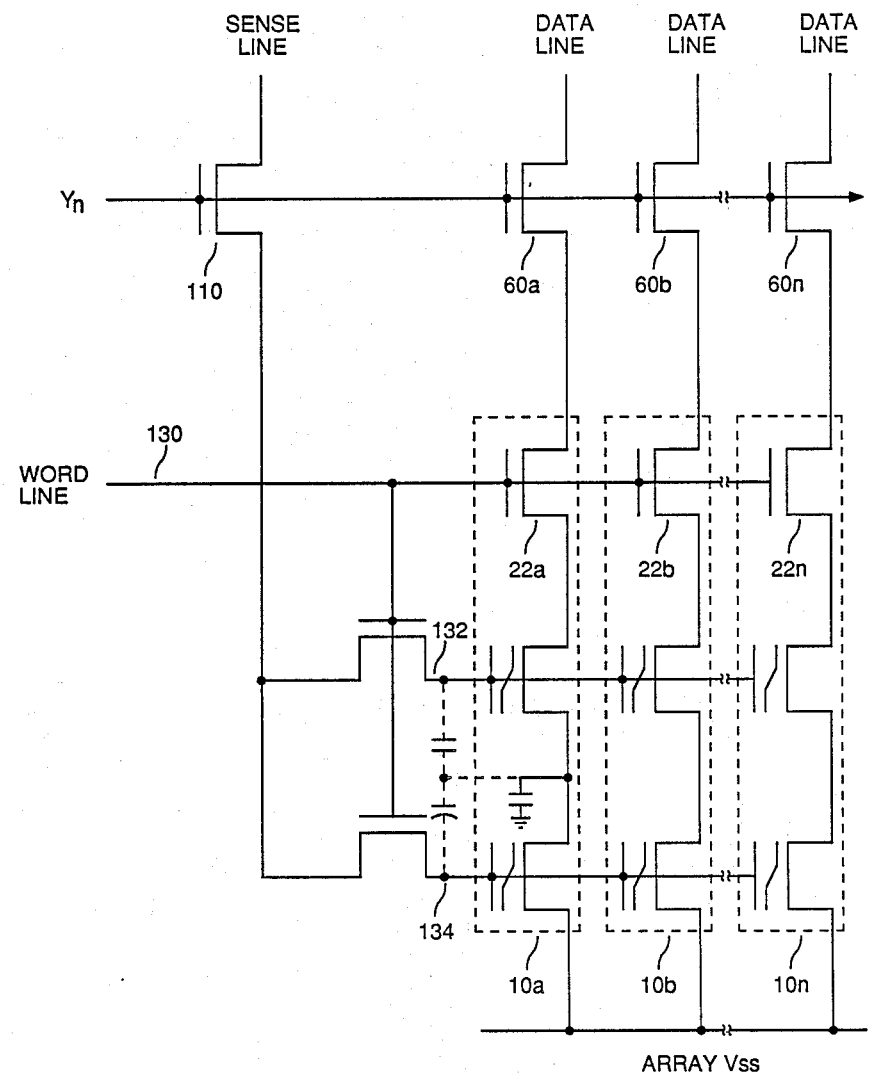
FIG. 4 is a schematic diagram of a representative array configured according to a second embodiment of the present invention.

Referring now to FIG. 4, an alternate embodiment of an array configured according to the present invention is disclosed. In the embodiment of FIG. 4, a single sense line select transistor 110 is employed instead of the two sense line select transistors 62 and 64 of FIG. 2. In most respects, the embodiment of FIG. 4 operates in the same manner as the embodiment of FIG. 2, except that the node common to both cell transistors, between the drain of the lower transistor and the source of the upper transistor, should have a relatively large capacitance compared to the parasitic capacitances between that node and the gate of each of the cell transistors. A ten to one ratio would be satisfactory. Such a large capacitance could be, for instance, a trench capacitor fabricated at the node.

Referring now to FIG. 5, it can be seen that a two-cycle programming sequence is used instead of the three cycle sequence of FIG. 3. First, during an erase cycle, depicted at 120, the bit lines are held at a low voltage. Word line 130 is held at a high voltage, sense line 132 is held at a high voltage, and sense line 134 is held at a high voltage. The Array Vss line is held at low voltage.

Next, during write cycle 136, the bit lines are held at a high voltage, and word line 130 is held at a high voltage. Sense lines 132 and 134 are allowed to oscillate between a low voltage and a voltage in between Vcc and the high voltage. During the oscillations of sense lines 132 and 134, incremental amounts of charge are transferred to the floating gates of the floating gate memory cell transistors, thus accomplishing programming. Because of the large node capacitance, the charge on the node will not leak off via the parasitic capacitances as the control gate voltage oscillates.

What is claimed is:

1. An electrically-erasable programmable read only memory cell, including, a first floating gate MOS transistor having a floating gate and having its source connected to a first potential, and its control gate connected to a first sense line, a second floating gate MOS transistor having a floating gate, the floating gate of said first floating gate MOS transistor being electrically isolated from the floating gate of said second floating gate MOS transistor and the source of said second floating gate MOS transistor connected to the drain of said first floating gate MOS transistor, and the control gate of said second floating gate MOS transistor connected to a second sense line, an MOS select transistor, having its source connected to the drain of said second floating gate MOS transistor, its gate connected to a word line, and its drain connected to a bit line, whereby if one of said floating gate MOS transistors fails, said memory cell will continue to function.

2. An array of floating gate electrically-erasable programmable read only memory cells, including:

a plurality of floating gate electrically-erasable programmable read only memory cells arranged into bytes, each of said cells including a first floating gate MOS transistor having a floating gate and having its source connected to a first potential, and its control gate connected to a first sense line, a second floating gate MOS transistor having a floating gate electrically isolated from the floating gate of said first floating gate MOS transistor and having its source connected to the drain of said first floating gate MOS transistor, and its control gate connected to a second sense line, a MOS select transistor, having its source connected to the drain of said second floating gate MOS transistor, and its gate connected to a word line, a bit line select transistor, associated with each memory cell, and bit line select transistor having its source connected to the drain of said select transistor of the memory cell with which it is associated, its drain connected to a data line, and its gate connected to a Y select line, a word line connected to the gates of all of said select transistors associated with a selected byte, a first array sense line, a second array sense line, a first sense line select transistor, having a drain connected to said first array sense line, a gate connected to said Y select line, and a source connected to a first byte sense line associated with said selected byte, a second sense line select transistor, having a drain connected to said second array sense line, a gate connected to said Y select line, and a source connected to a second byte sense line associated with said selected byte.

* * * * *